(12) United States Patent
Suzuki

(10) Patent No.: US 6,854,081 B1
(45) Date of Patent: Feb. 8, 2005

(54) INITIALIZING/DIAGNOSING SYSTEM IN ON-CHIP MULTIPROCESSOR SYSTEM

(75) Inventor: Katsuyuki Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/357,990

(22) Filed: Jul. 21, 1999

(30) Foreign Application Priority Data

Jul. 24, 1998 (JP) .......................................... 10-208889

(51) Int. Cl.[7] .............................................. G01R 31/28
(52) U.S. Cl. ........................ 714/733; 714/10; 714/797
(58) Field of Search ................................ 714/10, 11, 6, 714/820, 797, 30, 733, 734, 746, 724

(56) References Cited

U.S. PATENT DOCUMENTS

| 4,306,288 | A | * | 12/1981 | Nakamura .................. 710/100 |
| 5,226,149 | A | * | 7/1993 | Yoshida et al. |
| 5,812,757 | A | * | 9/1998 | Okamoto et al. |
| 5,903,717 | A | * | 5/1999 | Wardrop |
| 6,067,262 | A | * | 5/2000 | Irrinki et al. |
| 6,247,160 | B1 | * | 6/2001 | Davidsson et al. |
| 6,253,348 | B1 | * | 6/2001 | savidsson et al. |
| 6,367,044 | B1 | * | 4/2002 | Komoike |
| 6,732,300 | B1 | * | 5/2004 | Freydel ........................ 714/36 |
| 6,745,341 | B1 | * | 6/2004 | Onitsuka et al. ................ 714/7 |

FOREIGN PATENT DOCUMENTS

JP          3-19069          1/1991

OTHER PUBLICATIONS

Cutler et al "Distributed Self–Diagnosis of VLSI Mesh Array Processors" 1991 IEEE VLSI Test Seyposium, Paper 9.4, pp. 178–186.*
Wey et al "Built–In Self–Test (BIST) Structures for Analog Circuit Fault Diagnosis With Current Test Data" 1992 IEEE, vol. 41, pp. 535–539.*

* cited by examiner

*Primary Examiner*—Phung My Chung
(74) *Attorney, Agent, or Firm*—Sughrue Mion, PLLC

(57) ABSTRACT

A semiconductor chip of the present invention includes a plurality of first elements each of which diagnoses itself, and a second element which inputs diagnosis results from the first elements and determines whether or not there is a faulty first element in the first elements. A method of the present invention which is performed in a semiconductor chip including a plurality of first elements, includes diagnosing the first elements by itself; and determining whether or not there is a faulty first element in the first elements based on diagnosis results from the first elements.

27 Claims, 6 Drawing Sheets

INITIALIZING/DIAGNOSING SYSTEM IN ON-CHIP MULTIPROCESSOR SYSTEM

BACKGROUND OF THE INVENTION

The present invention relates to an initializing/diagnosing system in an on-chip multiprocessor system, which is a multiprocessor system including a plurality of central processing elements (CPUs), and other elements which are diagnosed, such as a main memory element, a main memory access controller, and an input output processor (IOP) are mounted on a single Large Scale Integration (LSI).

A conventional on-chip multiprocessor system is shown in FIG. 6. An on-chip multiprocessor system 200 is connected to an initialization/diagnosis control processor 20. Initialization/diagnosis control processor 20 is a processor dedicated to initialization/diagnosis control implemented by another LSI. Initialization/diagnosis control processor 20 is independent of on-chip multiprocessor system 200. On-chip multiprocessor system 200 includes a CPU group 21 including CPUs 211 to 21$m$ (m is an integer which satisfies m>0), a main memory access controller 22, a main memory element 23, and an IOP group 24 including IOPs 241 to 24$n$ (n is an integer which satisfies n>0).

Initialization/diagnosis control processor 20 starts the operation of initializing/diagnosing CPU group 21, main memory access controller 22, main memory element 23, and IOP group 24 by receiving an electric confirmation signal, when power is applied to on-chip multiprocessor system 200, as a trigger signal from a system control section, which controls "system start-up" and "general corrective process" regarding on-chip multiprocessor system 200. In this embodiment, the electric confirmation signal is a CPU initialization/diagnosis start instruction signal outputted from the system control section, and is typically represented by a signal notifying the application of power to on-chip multiprocessor system 200.

The initializing/diagnosing operation by initialization/diagnosis control processor 20 is performed by writing and reading data using a diagnosing path such as a scan path which is provided on each of the elements to be diagnosed, including CPU group 21, main memory access controller 22, main memory element 23, and IOP group 24.

The initialization/diagnosis control processor 20 outputs the diagnosed results to the system control section. The system control section disconnects the faulty elements however, in some situations, some non-faulty elements may also be disconnected.

In the conventional system, an initialization/diagnosis control processor that is independent of the CPUs and non-CPU to-be-diagnosed elements must be provided. This creates a problem because the number of hardware elements required to drive the on-chip multiprocessor system is increased.

The initialization/diagnosis control processor is usually designed with an inexpensive technology to reduce the manufacturing cost of the on-chip multiprocessor system and thus, the clock frequency of the initialization/diagnosis control processor is lower than the clock frequency (clock frequency of the CPUs and the like) at normal operation of the on-chip multiprocessor system. This creates a problem because the initializing/diagnosing operation becomes slow.

When the clock frequency of elements which are diagnosed, such as the CPUs, is different from the clock frequency of the initialization/diagnosis control processor, another problem occurs because it is necessary to also synchronize control.

A conventional diagnosing system for a multiprocessor is disclosed in Japanese laid-open publication Hei No. 3-19069. The diagnosing system for a multiprocessor includes a plurality of element processors, each of which compares its own processed result with processed results of another element processors, and a majority circuit which receives the compared results from the processors and determines the presence of an abnormal element processor by using majority logic. The system has the majority circuit, however, it does not diagnose the entire on-chip multiprocessor system, including non-CPU elements.

SUMMARY OF THE INVENTION

An object of the invention is to provide an initializing/diagnosing system in an on-chip multiprocessor system that can eliminate the initialization/diagnosis control processor.

According to one aspect of the present invention, a semiconductor chip is provided which includes: a plurality of first elements, each of which diagnoses itself; and a second element which inputs diagnosis results from the first elements and determines whether any of the first elements are faulty.

According to another aspect of the present invention, a method which is performed in a semiconductor chip including a plurality of first elements is provided which includes: having the first elements diagnose themselves; and determining whether any of the first elements are faulty based on diagnosis results of the first elements.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

Figure 1:
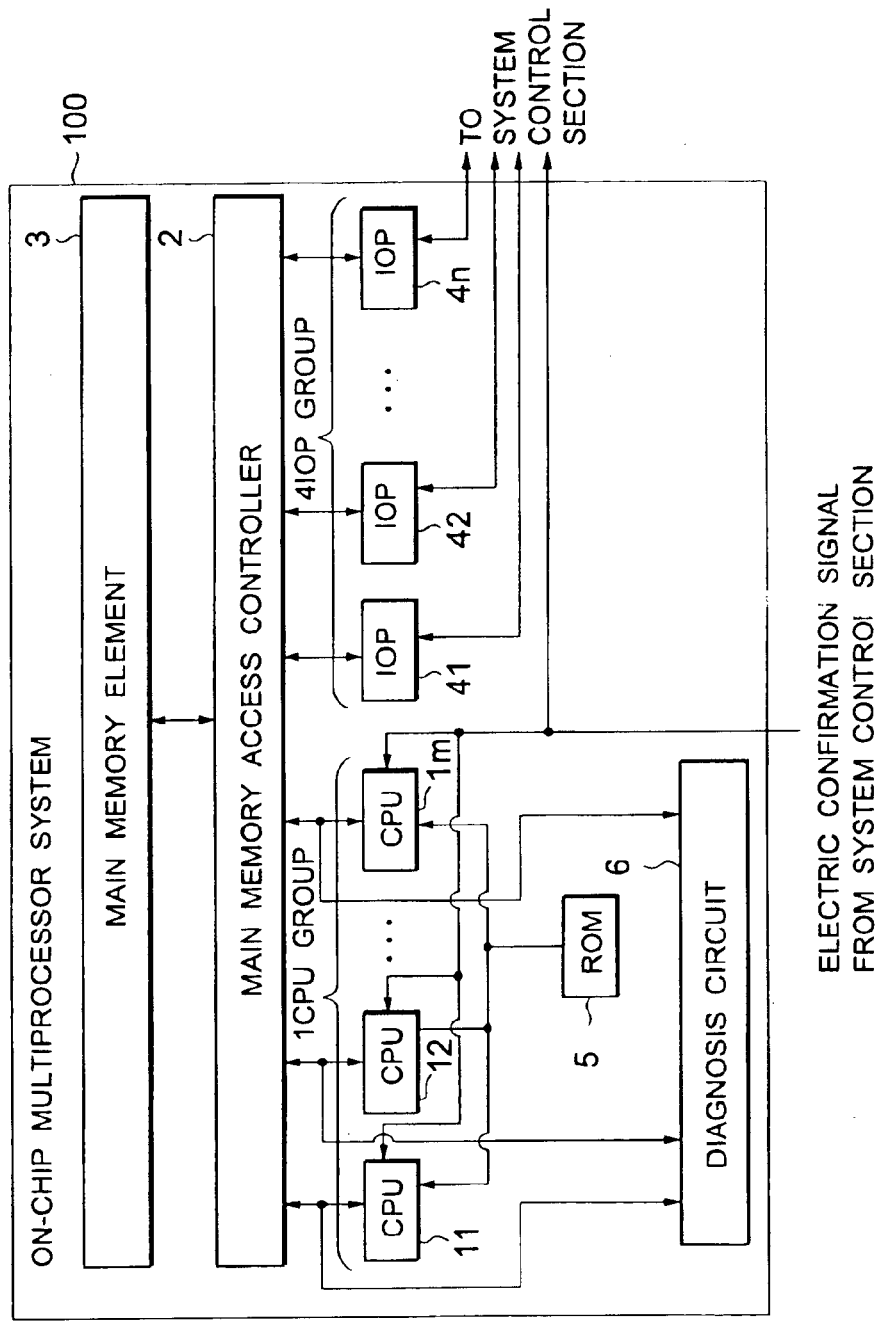
FIG. 1 is a block diagram of a first embodiment of the present invention.

A first embodiment of the present invention will be described in detail below.

An on-chip multiprocessor system 100 includes a CPU group 1, a main memory access controller 2, a main memory element 3, an IOP group 4, Read Only Memory (ROM) 5, and a diagnosis circuit 6. CPU group 1 includes CPUs 11 to 1$m$ (m is an integer which satisfies m>0). IOP group 4 includes IOPs 41 to 4$n$ (n is an integer which satisfies n>0). ROM 5 works as a program storing element. CPU group 1, main memory access controller 2, main memory element 3, IOP group 4, ROM 5, and diagnosis circuit 6 are mounted on a single LSI (the on-chip multiprocessor system).

ROM 5 stores an initializing/diagnosing program for CPU group 1 (CPU initializing/diagnosing program) and an initializing/diagnosing program for each of main memory access controller 2, main memory element 3, and IOP group 4 (hereinafter referred to as non-CPU to-be-diagnosed element initializing/diagnosing program). Elements such as main memory access controller 2, main memory element 3, and IOP group 4 are hereinafter referred to as non-CPU to-be-diagnosed elements.

Each of CPUs 11 to 1*m* loads the CPU initializing/diagnosing program from ROM 5 when starting own initializing/diagnosing operation. Each of CPUs 11 to 1*m* performs the initializing/diagnosing operation for the non-CPU to-be-diagnosed elements based on the non-CPU to-be-diagnosed element initializing/diagnosing programs when initializing/diagnosing operation for the non-CPU to-be-diagnosed elements. The initializing/diagnosing operation is similar to that in the prior art.

In this embodiment, the CPU initializing/diagnosing program and the non-CPU to-be-diagnosed element initializing/diagnosing programs can be individually stored in a plurality of program storing elements (ROMs).

Figure 2:
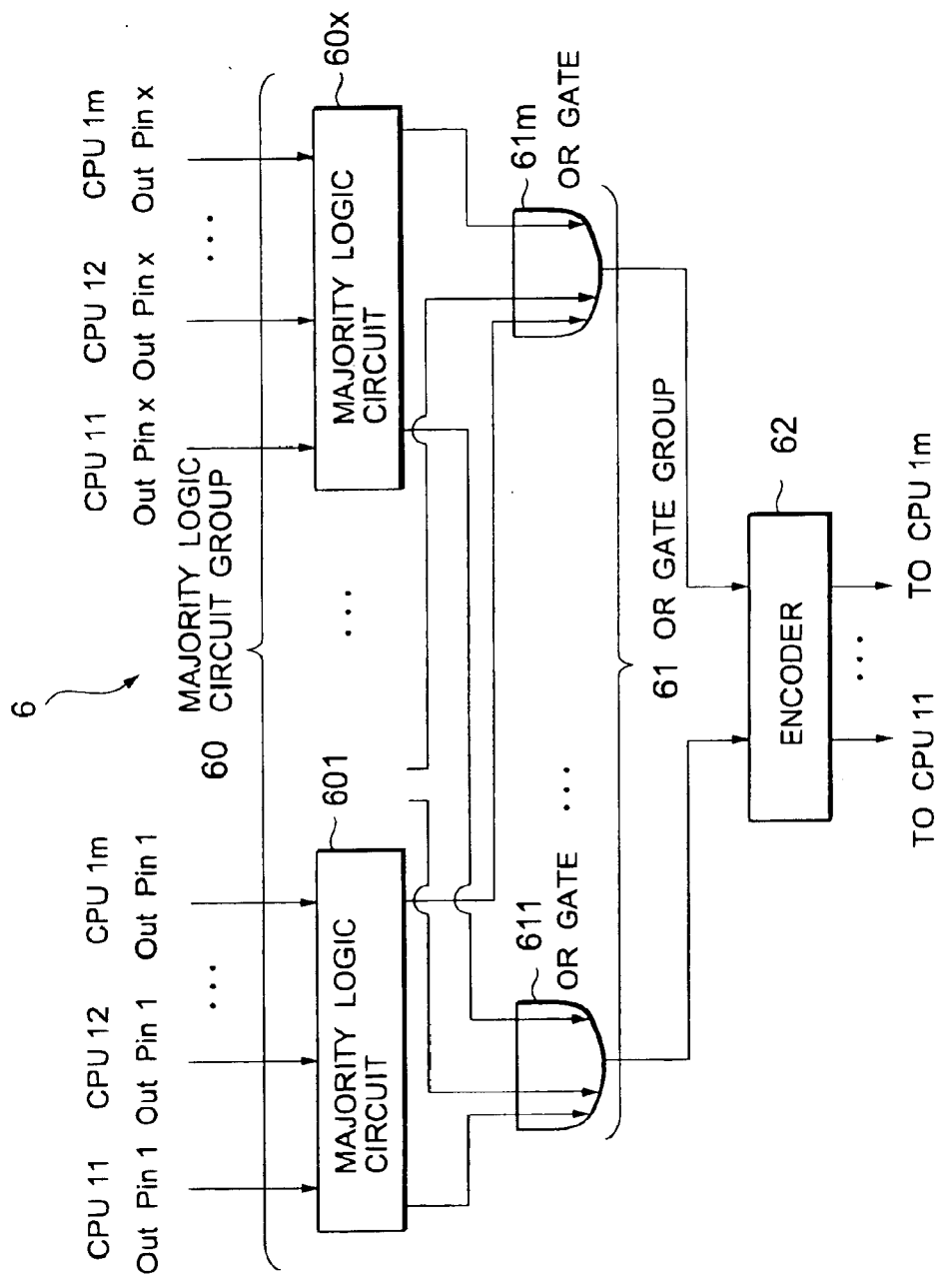
FIG. 2 is a block diagram of a diagnosis circuit of the present invention.

Referring to FIG. 2, diagnosis circuit 6 includes a majority logic circuit group 60 having majority logic circuits 601 to 60*x* (x is an integer which satisfies x>0), an OR gate group 61 having OR gates 611 to 61*m*, and an encoder 62.

Majority logic circuits 601 to 60*x* are provided to correspond to pins of CPUs 11 to 1*m* which have the same pin configuration. Specifically, majority logic circuit 601 corresponds to a first output pin of each of CPUs 11 to 1*m*. Majority logic circuit 60*x* corresponds to an xth output pin of each of CPUs 11 to 1*m*. Each of majority logic circuits 601 to 60*x* outputs m outputs. Each of the m outputs correspond to each of CPUs 11 to 1*m*.

OR gates 611 to 61*m* are provided to correspond to CPUs 11 to 1*m*, respectively. Each of OR gates 611 to 61*m* inputs outputs, which correspond the same CPU, from majority logic circuits 601 to 60*x*. Specifically, OR gate 611 inputs outputs which correspond to CPU 11 from every majority logic circuit 601 to 60*x*. OR gate 61*m* inputs outputs which correspond to CPU 1*m* from every majority logic circuit 601 to 60*x*.

Figure 3:
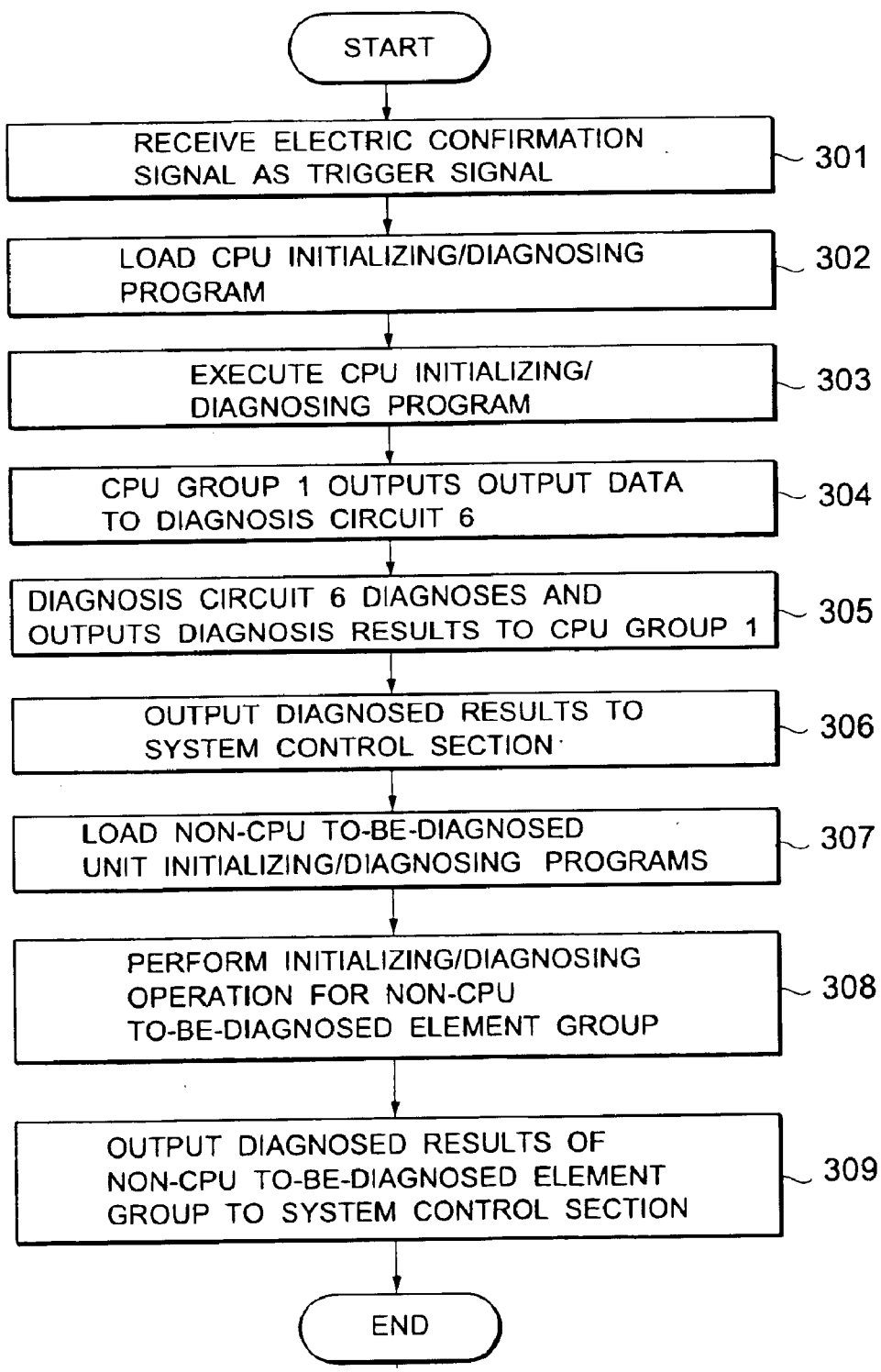
FIG. 3 is a flowchart showing a process of the first embodiment of the present invention.

Referring to FIG. 3, a process of the initializing/diagnosing system in the on-chip multiprocessor system includes a trigger signal reception step 301, a CPU initializing/diagnosing program load step 302, a CPU initializing/diagnosing program execution start step 303, an output data notification step 304, a diagnosis circuit-made diagnosis and diagnosed result notification step 305, a system control section-addressed CPU group diagnosed result notification step 306, a non-CPU to-be-diagnosed element initializing/diagnosing program load step 307, a non-CPU to-be-diagnosed element group initializing/diagnosing operation execution step 308, and a system control section-addressed non-CPU to-be-diagnosed element group diagnosed result notification step 309.

Next, the operation of this embodiment will be described.

Upon application of power to the on-chip multiprocessor system, the on-chip multiprocessor system starts up, and CPUs 11 to 1*m* receive an electric confirmation signal as a trigger signal from a system control section (step 301).

When CPUs 11 to 1*m* receive the electric confirmation signal in step 301, each of CPUs 11 to 1*m* loads the CPU initializing/diagnosing program from ROM 5 to perform their own initializing/diagnosing operations (step 302), and starts executing the CPU initializing/diagnosing program (step 303).

Each of CPUs 11 to 1*m* outputs its output data, which is obtained during the execution of the CPU initializing/diagnosing program, to diagnosis circuit 6 (step 304). The output data from each of CPUs 11 to 1*m* is a set of output bits from x output pins.

Diagnosis circuit 6 receives the output data from each of CPUs 11 to 1*m*, diagnoses the presence or absence of a fault in each of CPUs 11 to 1*m* by a majority logic based on each output bit of the output data, and outputs an encoded value indicating the diagnosed result to each of CPUs 11 to 1*m* (step 305).

Next, the operation of diagnosis circuit 6 will be described in detail.

Referring to FIG. 2, majority logic circuits 601 receives m output bits from the first of the output pins (out pin 1) of CPUs 11 to 1*m*, respectively. Majority logic circuit 60*x* receives m output bits outputted from xth output pins (out pin x) of CPUs 11 to 1*m*, respectively. Majority logic circuits 601 outputs m outputs, each of which corresponds to each of m inputs (each of CPUs 11 to 1*m*), to each of OR gates 611 to 61*m*. Each of the majority logic circuits 601 to 60*x* obtains a majority logic of the m inputs (discriminates the m inputs into a majority group and a minority group), sends out "0" as outputs corresponding to the majority group inputs among the m inputs, and "1" as the outputs corresponding to the minority-group inputs.

That is, a majority logic circuit 60*y* (y is an integer which satisfies 1<y<x) receives m output bits outputted from every yth output pin of CPUs 11 to 1*m*, divides the received m inputs into a majority group and a minority group, and sets the output signals corresponding to the majority group inputs to "0" and sets the output signals corresponding to the minority group inputs to "1", and outputs the m output signals to OR gates 611 to 61*m*, respectively. For example, if none of CPUs 11 to 1*m* fail, all majority logic circuits 601 to 60*x* have m inputs (output bits of CPUs 11 to 1*m*) that are the same value, and output "0".

OR gates 611 receives outputs which corresponds to CPU 11 from each of majority logic circuits 601 to 60*x*. OR gate 61*m* receives outputs which corresponds to CPU 1*m* from each of majority logic circuits 601 to 60*x*. Each of OR gates 611 to 61*m* outputs an OR obtained from these received outputs. As a result, if any one of CPUs 11 to 1*m* fail, the OR gate corresponding to a faulty CPU outputs "1", which indicates that a CPU has failed.

Encoder 62 encodes the outputs of OR gates 611 to 61*m* and outputs the encoded values to all of the CPUs 11 to 1*m*. The encoded value contains information indicating the CPU number of a faulty CPU. If there are a plurality of faulty CPUs, then the CPU numbers of the faulty CPUs are reported to CPUs 11 to 1*m* over a predetermined period of time.

CPUs 11 to 1*m* recognize the presence or absence of a faulty CPU and a faulty CPU based on the encoded value from encoder 62. Because each of CPUs 11 to 1*m* holds its own CPU number in its register, each CPU can determine whether it is operating normally or not depending on whether the encoded value coincides with its own CPU number. The CPU number is set by configuration information held by the system control section at the time of start-up of the on-chip multiprocessor system.

Referring to FIG. 3, in step 306, a CPU in CPU group 1 having recognized that it is operating normally (hereinafter referred to as "normal CPU") outputs the diagnosed result of CPU group 1 to the system control section. For example, a normal CPU having the smallest CPU number in CPU-group 1 notifies the system control section with information indicating the CPU number of a faulty CPU as the diagnosed result. The faulty CPU is degraded by the system control section at the end of the initializing/diagnosing operation for CPU group 1.

In step 307, when the initializing/diagnosing operation for CPU group 1 has completed, a group of normal CPUs in CPU group 1 loads, from ROM 5, the non-CPU to-be-diagnosed element initializing/diagnosing programs for main memory access controller 2, main memory element 3, and IOP group 4. The group of normal CPUs executes the initializing/diagnosing operation for the non-CPU to-be-diagnosed elements (step 308).

There are various ways to allot initializing/diagnosing operation to each normal CPU in the normal CPU group. It is likely that the operation is uniformly allotted to the normal CPUs and every normal CPUs performs shared pieces of initializing/diagnosing operation allotted to themselves simultaneously.

In step 309, when the initializing/diagnosing operation based on the non-CPU to-be-diagnosed element initializing/diagnosing programs has completed, the normal CPU group notifies the system control section of the diagnosed results of the non-CPU to-be-diagnosed element group. The elements determined to have a fault among the non-CPU to-be-diagnosed elements are disconnected, however, in some situations, some non-faulty elements may also be disconnected.

The configuration of diagnosis circuit 6 is not limited to that shown in FIG. 2, but may be of any type as long as the diagnosis circuit can diagnose the presence or absence of a fault in each of CPUs 11 to 1$m$ in CPU group 1 using the majority logic.

Further, the elements belonging to the non-CPU to-be-diagnosed element group are not limited to those shown in FIG. 1, such as, main memory access controller 2, main memory element 3, and IOP group 4.

As described above, it is possible to reduce the number of hardware elements required to drive the on-chip multiprocessor system because a processor dedicated to initialization/diagnosis control (initialization/diagnosis control processor) can be eliminated.

The initializing/diagnosing operation can be performed at a clock-frequency during normal operation of the on-chip multiprocessor system because the LSI (the on-chip multiprocessor system), makes a self-diagnosis. Therefore, the present invention can perform the initializing/diagnosing operation at higher speeds than the prior art that uses the initialization/diagnosis control processor.

Because the elements subjected to the initializing/diagnosing operation are mounted on the LSI (the on-chip multiprocessor system), synchronous control of clock frequency between the to-be-diagnosed elements including CPUs and the initialization/diagnosis control processor is not required.

It is also possible to reduce the manufacturing cost of the LSI implementing the on-chip multiprocessor system because the LSI implementing the on-chip multiprocessor itself has a sophisticated self-diagnosis function as described above and thus an inspection step based on the function of an LSI tester can be omitted.

Next, a second embodiment of the present invention will be described in detail.

A feature of the second embodiment is configuration which achieve system evaluation and efficiency in failure analysis.

Figure 4:
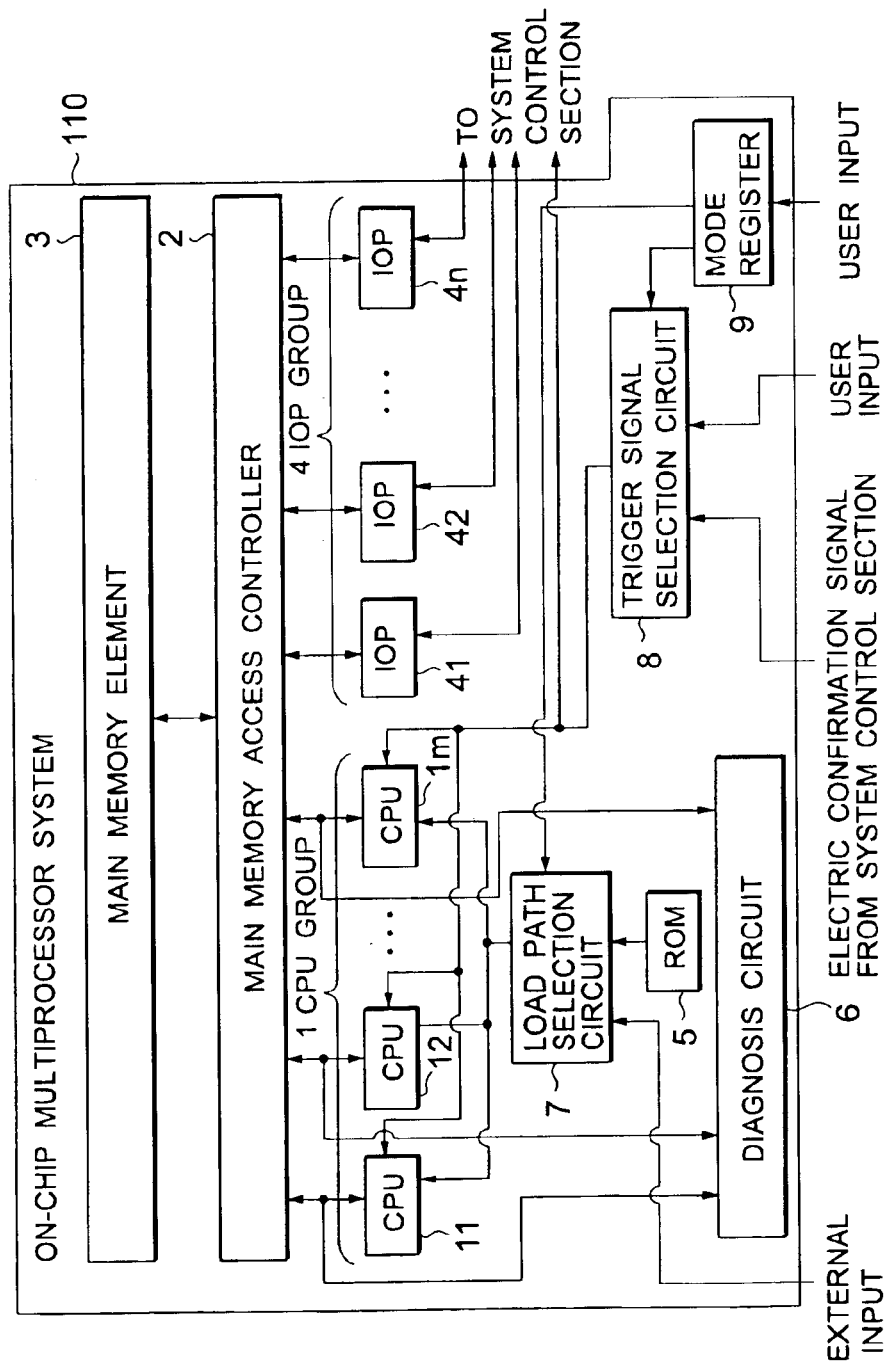
FIG. 4 is a block diagram of a second embodiment of the present invention.

Referring to FIG. 4, an on-chip multiprocessor system 110 includes a CPU group 1 consisting of CPUs 11 to 1$m$, a main memory access controller 2, a main memory element 3, an IOP group 4 consisting of IOPs 41 to 4$n$, a ROM 5 which works as a program storing element, a diagnosis circuit 6, a load path selection circuit 7, a trigger signal selection circuit 8, and a mode register 9 that implements a mode information storing element which stores mode information that consists of two bits, i.e., the 0th bit and the first bit. CPU group 1, main memory access controller 2, main memory element 3, IOP group 4, ROM 5, diagnosis circuit 6, load path selection circuit 7, trigger signal selection circuit 8, and mode register 9 are mounted on a single LSI (the on-chip multiprocessor system).

Figure 5:
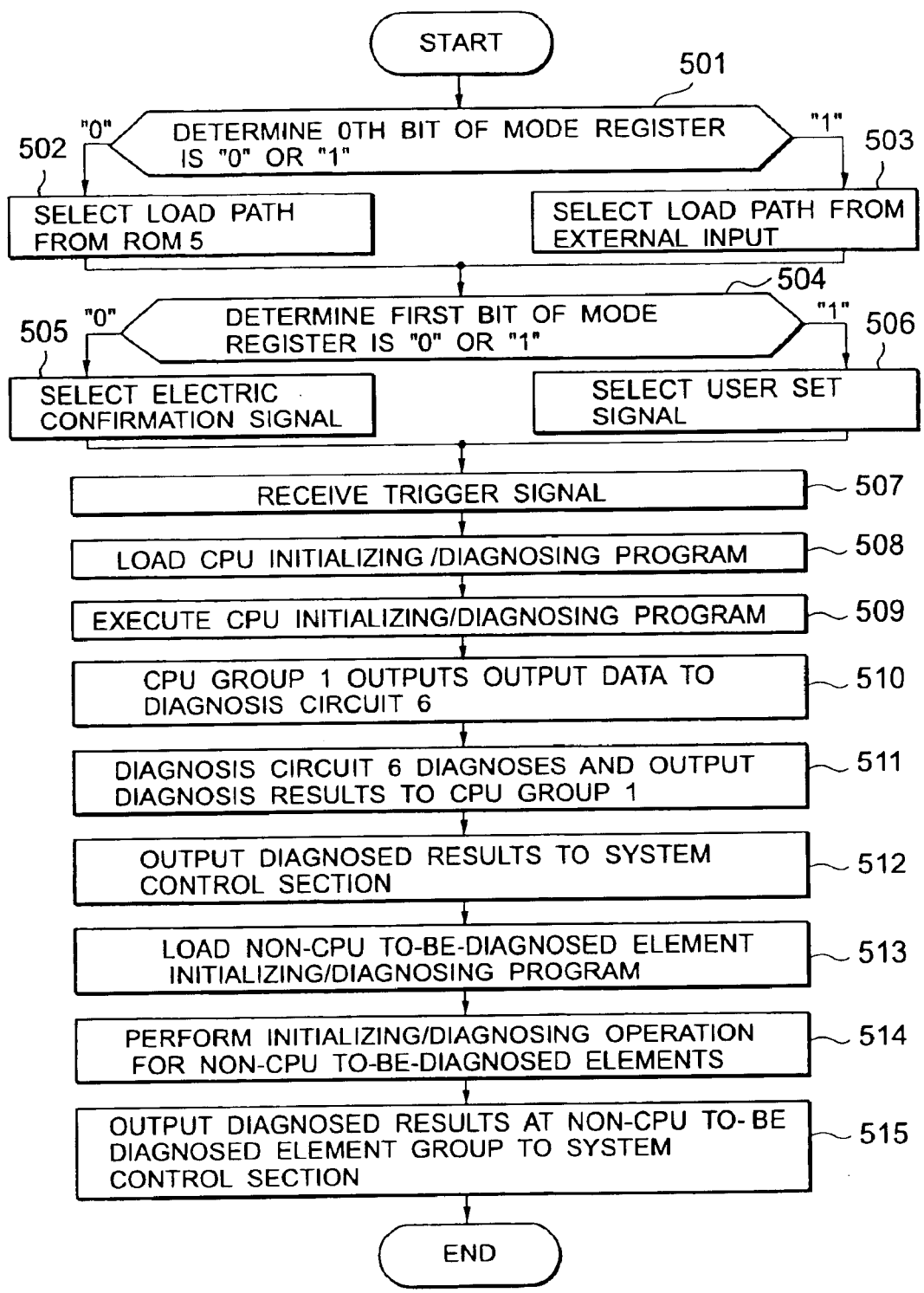
FIG. 5 is a flowchart showing a process of the second embodiment of the present invention.
Figure 6:
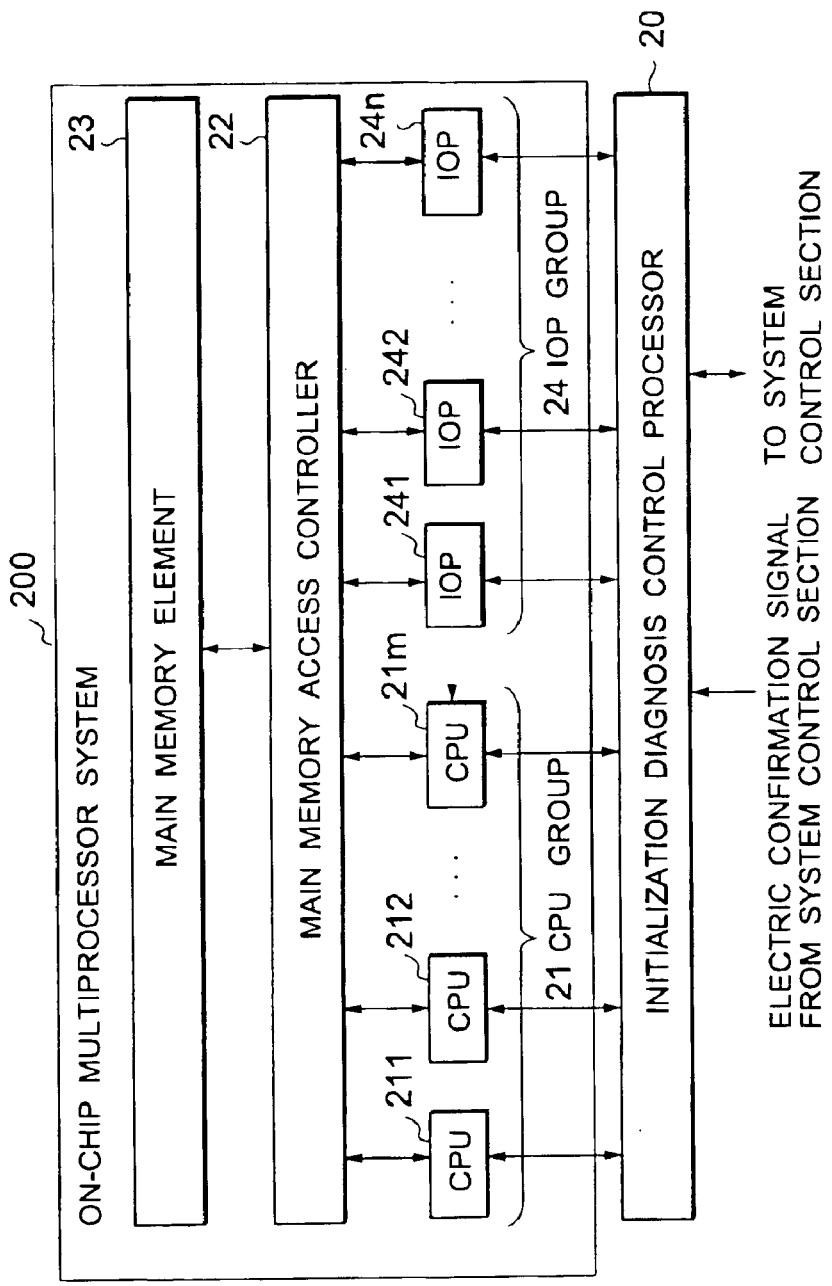
FIG. 6 is a block diagram of a conventional on-chip multiprocessor system and initialization/diagnosis control processor.

In FIG. 5, the process of initializing/diagnosing the system in the on-chip multiprocessor system includes a load path mode determination step 501, a via-ROM-data-input load path selection step 502, a via-external-data-input load path selection step 503, a trigger signal mode determination step 504, an electric confirmation signal (as a trigger signal) selection step 505, a user set signal (as a trigger signal) selection step 506, a trigger signal reception step 507, a CPU initializing/diagnosing program load step 508, a CPU initializing/diagnosing program execution start step 509, an output data notification step 510, a diagnosis circuit-made diagnosis and diagnosed result report step 511, a system control section-addressed CPU group diagnosed result notification step 512, a non-CPU to-be-diagnosed element initializing/diagnosing program load step 513, a non-CPU to-be-diagnosed element group initializing/diagnosing operation execution step 514, and a system control section-addressed non-CPU to-be-diagnosed element group diagnosed result notification step 515.

The detailed configuration of diagnosis circuit 6 is shown in FIG. 2.

Next, the operation of this embodiment will be described.

The mode register 9 holds mode information in the 0th and first bits as set by the user in advance. The following items 1) and 2) show the mode information:

1) When a path via a data input from ROM 5 is selected as an initializing/diagnosing program load path, the 0th bit is set to "0". On the other hand, when a load path via a data input from an external input is selected, the 0th bit is set to "1".

2) When a trigger signal that triggers the start of the initializing/diagnosing operation by CPUs 11 to 1$m$ is used as "an electric confirmation signal outputted from the system control section when the power is applied to the on-chip multiprocessor," the first bit is set to "0". On the other hand, when the trigger signal is used as "a user set signal that the user specified (entered) from a console, or the like, when the user wishes to trigger the operation himself," the first bit is set to "1".

The aforementioned settings are merely one example.

In step 501, load path selection circuit 7 determines whether the 0th bit of mode register 9 is set to "0" or "1". If the bit is set to "0", load path selection circuit 7 selects to load the initializing/diagnosing programs (the CPU initializing/diagnosing program and the non-CPU-to-be-diagnosed element initializing/diagnosing programs) via a data input from ROM 5 (step 502). If the 0th bit of mode register 9 is set to "1", the circuit 7 loads the initializing/diagnosing programs via a data input from an external input (step 503). In this way, load path selection circuit 7 switches the paths through which CPUs 11 to 1$m$ load the initializing/diagnosing programs.

In step 504, trigger signal selection circuit 8 determines whether the first bit of mode register 9 is set to "0" or "1". If the bit is set to "0", the circuit 8 uses the electric confirmation signal as a trigger signal that triggers the start of the initializing/diagnosing operation (step 505). If the first bit of mode register 9 is set to "1", trigger signal selection circuit 8 uses the user set signal as the trigger signal (step 506). In this way, trigger signal selection circuit 8 implements trigger signal switching.

Upon reception of the trigger signal (the electric confirmation signal or user set signal) selected by trigger signal selection circuit 8 in step 507, CPUs 11 to 1$m$ load the CPU initializing/diagnosing program recorded in ROM 5 or the CPU initializing/diagnosing program based on a data input from an external input via the load path set based on the selection made by load path selection circuit 7 (step 508). In step 509, CPUs 11 to 1$m$ start executing the loaded CPU initializing/diagnosing program.

In steps 510 to 512, the initializing/diagnosing operation for CPUs 11 to 1$m$ is performed similarly to the operation in the on-chip multiprocessor according to the first embodiment. It is noted that steps 510 to 512 in FIG. 5 correspond to steps 304 to 306 in FIG. 3.

Further, at the end of the initializing/diagnosing operation for CPU group 1, a group of normal CPUs in CPU group 1 load the non-CPU to-be-diagnosed element initializing/diagnosing programs for the operation of initializing/diagnosing main memory access controller 2, main memory element 3, and IOP group 4 through the load path which is set based on the selection made by load path selection circuit 7. Specifically, the normal CPUs load the non-CPU to-be-diagnosed element initializing/diagnosing programs recorded in ROM 5 or the non-CPU to-be-diagnosed element initializing/diagnosing programs based on a data input from an external input (step 513), and perform the initializing/diagnosing operation for the aforementioned non-CPU to-be-diagnosed elements based on the loaded non-CPU to-be-diagnosed element initializing/diagnosing programs (step 514).

In step 515, the initializing/diagnosing operation for the non-CPU to-be-diagnosed elements is performed similarly to the operation in the on-chip multiprocessor according to the first embodiment. It is noted that step 515 in FIG. 5 corresponds to step 309 in FIG. 3.

As described above, this embodiment allows the user to variably set the timing for triggering the start of the initializing/diagnosing operation. Thus, even if the user finds the problems encountered at the time of the on-chip multiprocessor system start-up, this embodiment is advantageous because system evaluation can be performed efficiently and effectively. A problem encountered at the time of the on-chip multiprocessor system start-up, for example, is created because the problems that the on-chip multiprocessor system cannot be started up normally when logic bugs and failures are found in the CPUs and non-CPU to-be-diagnosed elements, and when there are bugs in initially set data, and the like.

Further, this embodiment allows the initializing/diagnosing programs to be executed by not only using the initializing/diagnosing programs recorded in ROM 5, but by also using the initializing/diagnosing programs based on data input from an external input. Therefore, various initializing/diagnosing programs can be executed. Hence, this embodiment is advantageous because system evaluation and failure analysis can be performed more efficiently and effectively.

It is noted that mode switching can be effected only for one mode selected from the initializing/diagnosing program load path-related mode or the trigger signal-related mode. A configuration to be adopted in such a case is shown in items 1) and 2) below:

1) When switching is made only for the initializing/diagnosing program load path-related mode, the configuration is such that load path selection circuit 7 and mode register 9, which holds only the 0th bit as the mode information, both shown in FIG. 4, are added to the basic configuration shown in FIG. 1.

2) When switching is made only for the trigger signal-related mode, the configuration is such that trigger signal selection circuit 8 and mode register 9, which holds only the first bit as the mode information, both shown in FIG. 4, are added to the basic configuration shown in FIG. 1.

The configuration of diagnosis circuit 6 is not limited to that shown in FIG. 2, but may be of any type as long as circuit 6 can diagnose the presence or absence of a fault in each of CPUs 11 to 1$m$ in CPU group 1 using the majority logic as in the first embodiment. In addition, the non-CPU to-be-diagnosed elements are not limited to those shown in FIG. 4 (main memory access controller 2, main memory element 3, and IOP group 4) as in the first embodiment.

While this invention has been described in conjunction with the preferred embodiments described above, it will now be possible for those skilled in the art to put this invention into practice in various other manners.

What is claimed is:

1. A semiconductor chip comprising:
   a plurality of first elements each of which diagnosis itself; and
   a second element which inputs diagnosis results from said first elements and determines whether or not there is a faulty first element in said first elements;
   third elements which correspond to pins of said first element, each of which inputs said diagnosis results from same pins of said first elements, respectively, and each of which determine a minority one of said first elements based on said diagnosis results;
   fourth elements which correspond to said first elements and which determine whether or not the corresponding first element fails based on outputs from said third elements; and
   wherein said second element further includes a fifth element which outputs information about a faulty first element to said first elements.

2. The semiconductor chip as claimed in claim 1, further comprising a memory element which stores a program for diagnosing said first elements.

3. The semiconductor chip as claimed in claim 1, further comprising a sixth element which cannot diagnose itself.

4. The semiconductor chip as claimed in claim 3, wherein said sixth element is selected from a group consisting of a main memory, a main memory controller, and a processor which controls input and output process.

5. The semiconductor chip as claimed in claim 1, further comprising an external input which input a diagnosis program; and
   a seventh element which selects to load a diagnosis program from said memory element or said external input.

6. The semiconductor chip as claimed in claim 5, further comprising a register which stores information indicating which of a diagnosis program from said memory element or said external input said seventh element selects.

7. The semiconductor chip as claimed in claim 1, further comprising an eighth element which selects, as a trigger, a first signal set by a user or a second signal from a semiconductor chip which controls start up.

8. The semiconductor chip as claimed in claim 7, further comprising a register which stores information indicating which of said first or second signal said eighth element selects.

9. A method which is performed in a semiconductor chip including a plurality of first elements, comprising:
diagnosing said first elements each by itself;
discriminating each of diagnosis results into a majority group or a minority group;
determining one of said first elements whose diagnosis result is in said minority group as a faulty first element;
discriminating a minority one of said first elements based on diagnosis results input from same pins of said first elements;
determining where or not said first element fails based on the determined result determined during said discriminating step; and
outputting information about a faulty first element to said first elements.

10. The method as claimed in claim 9, further comprising:
diagnosing a sixth element which cannot diagnose itself.

11. The method as claimed in claim 9, wherein said semiconductor chip includes a memory element which stores a diagnosis program and an external input;
further comprising:
selecting to load a diagnosis program from said memory elements or said external input.

12. The method as claimed in claim 9, further comprising:
selecting, as a trigger, a first signal set by a user or a second signal from a semiconductor chip which controls start up.

13. A semiconductor chip comprising:
a plurality of CPUs, each of which diagnoses itself using a first diagnosis program;
a diagnosis element which inputs a diagnosis result from said CPUs and determines whether or not each of the CPUs is normal; and
a plurality of non-CPU to-be-diagnosed elements, each of which is diagnosed by at least one of said CPUs, which is determined to be normal, using a second diagnosis program.

14. The semiconductor chip as claimed in claim 13, wherein said diagnosis element determines whether or not each of the CPUs is normal based on majority logic of said diagnosis results.

15. The semiconductor chip as claimed in claim 13, wherein said diagnosis element inputs diagnosis results from said CPUs, discriminates each of said diagnosis results into a majority group or a minority group, and determines said CPUs, whose diagnosis results is in said majority group, as normal CPUs.

16. The semiconductor chip as claimed in claim 13, wherein said diagnosis element includes:
majority logic elements which correspond to pins of said CPUs, each of which inputs said diagnosis results from same pins of said CPUs, respectively, and each of which discriminates each of said diagnosis results into a majority group or a minority group; and
decision elements which correspond to said CPUs and which determine said CPU whose diagnosis result is in said majority group as a normal CPU.

17. The semiconductor chip as claimed in claim 16, wherein said diagnosis element further includes an information output element which outputs information about whether each of said CPUs is normal or faulty.

18. The semiconductor chip as claimed in claim 13, further comprising a memory which records said first diagnosis program and said second diagnosis program.

19. The semiconductor chip as claimed in claim 13, further comprising an external input which inputs said first diagnosis program and said second diagnosis program.

20. The semiconductor chip as claimed in claim 13, further comprising:
a memory which records said first diagnosis program and said second diagnosis program;
an external input which inputs said first diagnosis program and said second diagnosis program; and
a selector which selects said first diagnosis program and said second diagnosis program from the memory or the external input according to an instruction.

21. The semiconductor chip as claimed in claim 13, wherein each of said CPUs starts to diagnosis itself when it receives a trigger signal from a system control section.

22. The semiconductor chip as claimed in claim 13, wherein each of said CPUs starts to diagnosis itself when it receives a trigger signal from a user.

23. The semiconductor chip as claimed in claim 13, further comprising a selector which selects a signal to start diagnosis of said CPUs from a trigger signal from a system control section or a trigger signal from a user.

24. A method which is performed in a semiconductor chip including a plurality of CPUs and a plurality of non-CPU to-be-diagnosed elements, comprising:
diagnosing said CPUs each by itself;
determining whether or not each of the CPUs is normal; and
diagnosing said non-CPU to-be-diagnosed elements using a CPU which is determined to be a normal CPU.

25. A semiconductor chip comprising:
a plurality of CPUs, each of which diagnoses itself using a first diagnosis program;
a diagnosis element which inputs a diagnosis result from said CPUs and determines whether or not each of the CPUs is normal; and
a plurality of non-CPU to-be-diagnosed elements, each of which is diagnosed by a group of said plurality of said CPUs, which are determined to be normal, using a second diagnosis program.

26. A semiconductor chip comprising:
a plurality of first elements, each of which diagnoses itself using a first diagnosis program;
a diagnosis element which inputs a diagnosis result from said first elements and determines whether or not each of the first elements is normal; and
a plurality of second elements, each of which is diagnosed by at least one of said first elements, which is determined to be normal, using a second diagnosis program.

27. A semiconductor chip comprising:
a plurality of first elements, each of which diagnoses itself using a first diagnosis program;
a diagnosis element which inputs a diagnosis result from said first elements and determines whether or not each of the first elements is normal; and
a plurality of second elements, each of which is diagnosed by a group of said plurality of said first elements, which are determined to be normal, using a second diagnosis program.

* * * * *